United States Patent
Sikkink et al.

(10) Patent No.: US 9,252,812 B2
(45) Date of Patent: Feb. 2, 2016

(54) LOW LATENCY SERIAL DATA ENCODING SCHEME FOR ENHANCED BURST ERROR IMMUNITY AND LONG TERM RELIABILITY

(71) Applicant: Silicon Graphics International Corp., Milpitas, CA (US)

(72) Inventors: Mark Ronald Sikkink, Chippewa Falls, WI (US); John Francis De Ryckere, Eau Claire, WI (US)

(73) Assignee: Silicon Graphics International Corp., Milpitas, CA (US)

( * ) Notice: Subject to any disclaimer, the term of this patent is extended or adjusted under 35 U.S.C. 154(b) by 43 days.

(21) Appl. No.: 14/229,796

(22) Filed: Mar. 28, 2014

(65) Prior Publication Data
US 2015/0280746 A1    Oct. 1, 2015

(51) Int. Cl.
| | |
|---|---|
| H03M 13/00 | (2006.01) |
| H03M 13/17 | (2006.01) |
| H03M 13/09 | (2006.01) |
| H04L 1/00  | (2006.01) |
| H03M 13/11 | (2006.01) |

(52) U.S. Cl.
CPC .............. *H03M 13/17* (2013.01); *H03M 13/09* (2013.01); *H03M 13/11* (2013.01); *H04L 1/0057* (2013.01); *H04L 1/0061* (2013.01)

(58) Field of Classification Search
CPC ..... H03M 13/17; H03M 13/09; H03M 13/11; H04L 1/0061; H04L 1/0057
See application file for complete search history.

(56) References Cited

U.S. PATENT DOCUMENTS

| | | | | |
|---|---|---|---|---|
| 5,602,831 | A  * | 2/1997 | Gaskill | 370/252 |
| 6,662,332 | B1 * | 12/2003 | Kimmitt | 714/762 |
| 7,225,366 | B2 * | 5/2007 | Arao et al. | 714/47.2 |
| 7,454,682 | B2 * | 11/2008 | Lou et al. | 714/748 |
| 7,782,805 | B1 | 8/2010 | Belhadj et al. | 370/300 |
| 7,802,167 | B1 * | 9/2010 | Gorshe | 714/762 |
| 7,984,367 | B1 * | 7/2011 | Chaichanavong et al. | 714/788 |
| 8,289,640 | B2 * | 10/2012 | Fry et al. | 360/31 |
| 8,413,006 | B1 * | 4/2013 | Mok et al. | 714/752 |
| 8,943,393 | B1 | 1/2015 | Mendel et al. | 714/807 |
| 2002/0199153 | A1 * | 12/2002 | Fall | 714/781 |
| 2010/0083066 | A1 | 4/2010 | Sivaramakrishnan et al. | 714/748 |
| 2010/0281343 | A1 | 11/2010 | Caggioni et al. | 714/776 |
| 2010/0299578 | A1 | 11/2010 | Shin et al. | 714/776 |

OTHER PUBLICATIONS

International Searching Authority, International Search Report—International Application No. PCT/US2015/022935, dated Jul. 20, 2015, together with the Written Opinion of the International Searching Authority, 9 pages.

* cited by examiner

*Primary Examiner* — Esaw Abraham
(74) *Attorney, Agent, or Firm* — Sunstein Kann Murphy & Timbers LLP

(57) ABSTRACT

A high performance computing system and method communicate data packets between computing nodes on a multi-lane communications link using a modified header bit encoding. Each data packet is provided with flow control information and error detection information, then divided into per-lane payloads. Sync header bits for each payload are added to the payloads in non-adjacent locations, thereby decreasing the probability that a single correlated burst error will invert both header bits. The encoded blocks that include the payload and the interspersed header bits are then simultaneously transmitted on the multiple lanes for reception, error detection, and reassembly by a receiving computing node.

19 Claims, 9 Drawing Sheets

LOW LATENCY SERIAL DATA ENCODING SCHEME FOR ENHANCED BURST ERROR IMMUNITY AND LONG TERM RELIABILITY

TECHNICAL FIELD

The present invention relates to multiplex communications in a computer system, and more particularly to detecting and correcting burst errors in a multi-lane communications link.

BACKGROUND ART

High performance computing (HPC) systems include large, distributed systems having many computing nodes that communicate with each other to solve a shared computation. The connections between nodes are often formed from high speed serial interconnects that transmit bits of data (i.e., ones and zeroes) in parallel data lanes at a maximum speed, or bit rate. The long term reliability of high speed serial interconnects is being challenged as transmission rates increase. In particular, as bit rates increase, there is a corresponding increase in signal loss caused by the underlying physical media. This signal loss is managed by increasing circuit complexity, using higher cost materials, and actively repeating the signal (or reducing the physical distance between nodes). All of these mitigation tools attempt to achieve high Mean Time To False Packet Acceptance (MTTFPA), with maximum service time or availability.

One cause of signal loss is due to the physical nature of digital transmission media. Bits of data are transmitted on a physical medium by varying a voltage. For example, +1V may represent a value of 1, while −1V may represent a value of 0; different systems will use different voltages, but the concept is the same. The voltages are sampled by the receiving circuitry to determine the bit values at fixed intervals according to the bit rate. The physical material forming the channel that conveys these voltages from one point to another requires a small time to transition from one voltage to the other. Due to this voltage transition time, each transmitted bit "smears" its voltage value into a time slot allocated to the next bit. If the voltage transition frequency (that is, the reciprocal of the transition time) represents even a modest fraction of the bit rate, this smearing may cause the sampled voltage to reach less than its optimum value at the sampling time, and in fact may cause the sampled voltage to indicate an incorrect bit value. This is common when, for example, a 1-bit value (e.g. +1V) follows a long sequence of 0-bits that have given the physical media a sufficient time to strongly adjust to the 0-bit voltage (−1V).

This situation is improved by the use of pseudo-random bit patterns for transmitting bits. Data for transmission often are run through various encoding and decoding algorithms to provide a roughly even mix of transmitted 0-bits and 1-bits, which provides various electrical and data protocol advantages by reducing the probability of long 0-bit or 1-bit sequences. However, it is still possible to generate long runs of zeros or ones, occasionally causing strong voltage "smear" and incorrect bit decisions at the optimum sampling time as described above.

For these reasons, various algorithms are employed to increase the gap between the minimum sampled 1-bit voltage and the maximum sampled 0-bit voltage. These gaps are often visualized using plots of the voltage waveforms overlapping over time. These plots are called "eye diagrams" because the shape of the overlapping waveforms resembles the appearance of a human eye. Algorithms for increasing the distance between sampled voltages "open the eyes" in the diagram, and improve bit recognition rates by receivers.

One of the common algorithms for increasing the voltage gap is decision feedback equalization (DFE). This algorithm works by sampling the "smear" caused by receipt of each bit (or a number of previous bits) and adding a multiple of that smear to the voltage of the next received signal, before the signal is sampled to determine the bit. By adding this correction signal, the channel dynamically increases the 1-bit voltage and decreases the 0-bit voltage for each sampled bit by using feedback from the previous bit(s), thereby "equalizing" the channel voltages. The smeared bits that are sampled for this purpose are called "tapped", and thus there are single-tap and multi-tap DFEs.

The DFE algorithm can cause burst errors, as now described. A "burst error" occurs when an algorithm for which the determination of a given bit value as a 0 or a 1 influences the determination of the next bit value, so that errors have a chance to propagate to one or more subsequent bits, thereby producing a localized "burst" of errors. In the case of DFE, the addition of smear from an incorrectly detected bit value will move the channel voltage in the wrong direction when the next bit is sampled, increasing the probability that the next bit will also be incorrectly detected. The DFE smear multiplier is typically small, e.g. one tenth of the transmission voltage in an exemplary system, so the system will eventually correct itself after detecting a correct bit (or, in a multi-tap system, a series of correct bits). However, correction will occur only after the receiver has been impacted by the burst error.

Various means are known to reduce the effect of burst errors on receivers. Channel architecture and data coding can improve burst error minimization. Specifically, data striping and bit transmission order impact error detection and correction capability in the presence of burst errors. Recently, some standards organizations have developed standards (IEEE 802.3bj and IFBTA) that incorporate Forward Error Correction (FEC) into their specifications to address reliability issues. FEC involves the addition of check bits into the data stream, and thereby permits correction of faulty bits, but at the cost of significant added latency. Moreover, this latency cumulates over each hop between nodes in an HPC system. At 25 gigabits per second (Gb/s) bit rate, the latency increase for an exemplary standards-based Reed-Solomon FEC code is greater than 50 nanoseconds (ns) per hop. This increase is unacceptable for a latency sensitive protocol in a HPC system, and in particular for one where the average uncorrected per-hop latency is well under 100 ns, because it dramatically reduces system performance. The status quo data transmission that lacks error correction and processes the resultant uncorrected burst error bits, also is unacceptable because it can lead to system crashes.

SUMMARY OF THE EMBODIMENTS

Therefore, to address the above disadvantages, various embodiments of the present invention provide a serial data encoding scheme that improves MTTFPA in the presence of decision feedback equalization (DFE) burst errors, without increasing latency. Estimated worst case correlated burst error and random error performance is plotted for three examples in FIG. 4, to compare the relative effectiveness of the approaches discussed above with the disclosed solution. Each approach uses a single tap DFE approximation. At low bit error rates (BER), DFE burst errors dominate reliability. The conventional, uncorrected DFE time-to-failure is shown as the bottom curve 41. A latency-adding, FEC error-corrected time-to-failure is shown as the top curve 42. An embodiment of the disclosed invention produces the middle curve 43, which shows approximately four orders of magnitude increase in time-to-failure, without adding the latency required by FEC.

At a target BER of $10^{-12}$, the conventional code gives an MTTFPA of 100,000 years versus an MTTFPA of 600 million years for the enhanced code. A Reed-Solomon FEC with parameters (528,514) gives the best MTTFPA, but at the cost of added latency that is not reflected in FIG. 4. With FEC, network diameters reliably grow to very large dimensions. For small to medium diameter networks, the disclosed invention allows reliable scaling without adding significant latency per hop.

Therefore, in a first embodiment of the invention, a computerized method of communicating a data packet using a communications link that has a plurality of communication lanes is provided. The method has five computerized processes. In the first process, the method provides the data packet with flow control information and error detection information, thereby forming a flow control unit. In the second process, the method chooses a transmission header from a plurality of headers as a function of a type of the data packet. The transmission header has a plurality of bits. In the third process, the method divides the flow control unit into equally sized payloads. The number of payloads is equal to the number of communication lanes, and each payload is associated with a respective communication lane. In the fourth process, the method inserts into each payload at an identical first location, a first bit of the chosen transmission header, and inserts, into each payload at an identical second location, a second bit of the chosen transmission header. The first and second locations are non-adjacent. The combination of each payload and the inserted first and second bits forms a corresponding "encoded block". Finally, in the fifth process, the method simultaneously transmits to a receiver each encoded block on the respective communication lane of its payload. Burst errors in reception of the encoded blocks by the receiver are detectable as a function of the first and second locations.

Various modifications and additions are contemplated. For example, a sixth process may reassemble the encoded blocks in the receiver to recover the data packet, wherein the recovered data packet is used to perform in the receiver a portion of a shared computation in a high performance computing system. The communications link may include a networking cable or a data bus on a backplane of a computer chassis, and may have at least four communication lanes.

Several options exist for the placement of the header bits in the encoded block. Thus, the first location may be at the beginning of each block and the second location is in the middle of each block, in which case the error detection information is a cyclic redundancy check (CRC) having a length at least half the length of the block, so that detection of burst errors within the block and between successive blocks is improved. Alternately, the first location may be at the beginning of each block and the second location is at the end of each block, so that detection of burst errors between successive blocks is improved. Or, the error detection information may be a cyclic redundancy check (CRC) having a length less than half the length of the block, and the first location and the second location are separated by the length of the CRC, so that burst errors in successive blocks are detected separately.

Moreover the method may also include detecting a burst error by determining that the received header bits in a first communication lane differ from the received header bits in a second communication lane. Alternately or in addition, the method may include detecting a burst error by determining that the received header bits in a communication lane are invalid.

A high performance computing (HPC) system for carrying out the above-described method and its variants is also disclosed. More specifically, the HPC system may include a plurality of computing nodes, where at least a first computing node and a second computing node being connected by a high-speed, low-latency data communications link. The method may be performed by packet processors disposed in the various connected computing nodes, which may be application specific integrated circuits (ASICs) or field programmable gate arrays (FPGAs) as those terms are known in the art.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

In accordance with illustrated embodiments of the invention, a high performance computing system and method communicate data packets between computing nodes on a multi-lane communications link using a modified header bit encoding. Each data packet is provided with flow control information and error detection information, then divided into per-lane payloads. Sync header bits for each payload are added to the payloads in non-adjacent locations, thereby decreasing the probability that a single correlated burst error will invert both header bits. The encoded blocks that include the payload and the interspersed header bits are then simultaneously transmitted on the multiple lanes for reception, error detection, and reassembly by a receiving computing node. Operation of the system is now described in detail.

System Architecture

Figure 1:
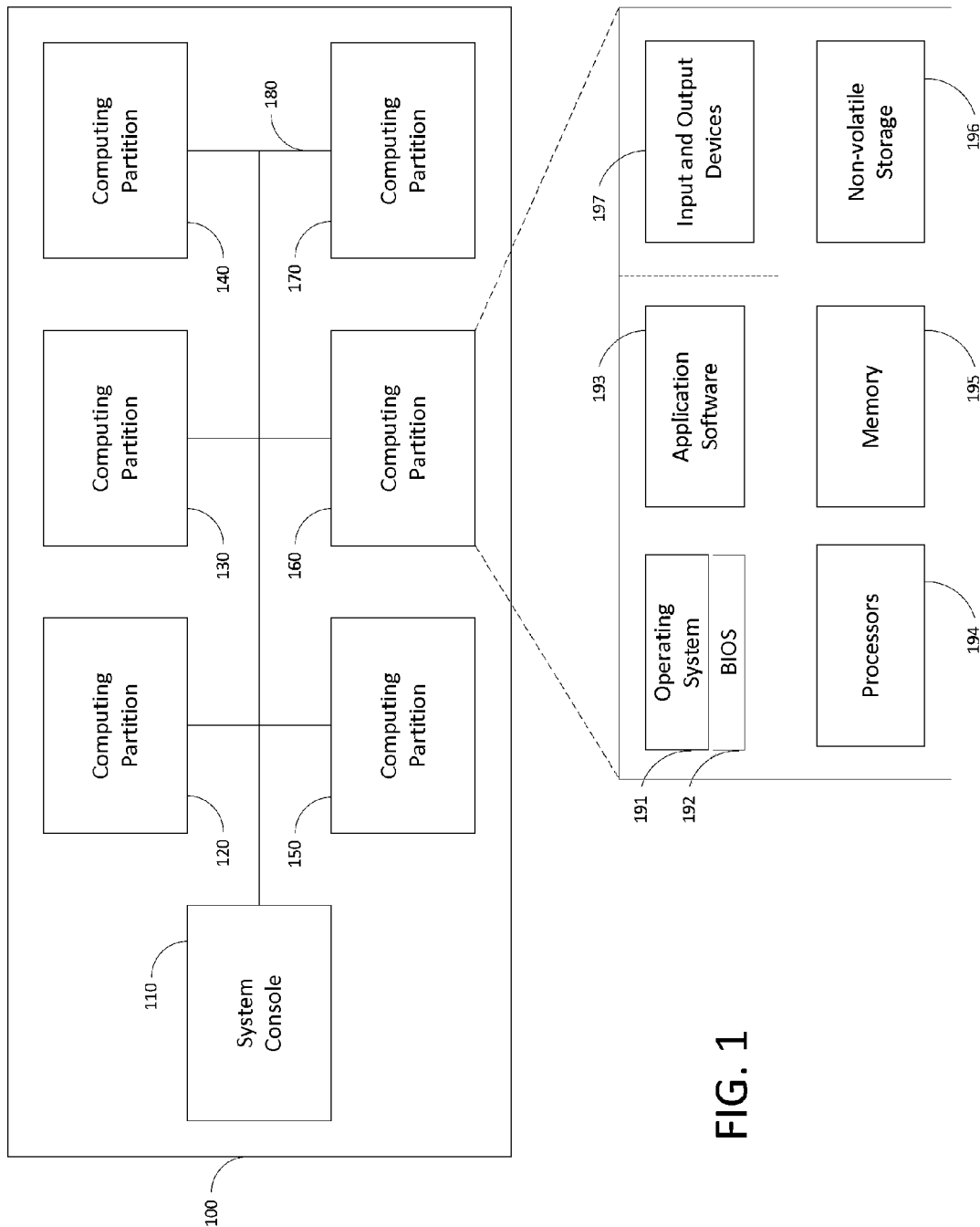
FIG. 1 schematically shows a logical view of an HPC system in accordance with one embodiment of the present invention.

FIG. 1 schematically shows a logical view of an exemplary high-performance computing system 100 that may be used with illustrative embodiments of the present invention. Specifically, as known by those in the art, a "high-performance computing system," or "HPC system," is a computing system having a plurality of modular computing resources that are tightly coupled using hardware interconnects, so that processors may access remote data directly using a common memory address space.

The HPC system 100 includes a number of logical computing partitions 120, 130, 140, 150, 160, 170 for providing computational resources, and a system console 110 for managing the plurality of partitions 120-170. A "computing partition" (or "partition") in an HPC system is an administrative allocation of computational resources that runs a single operating system instance and has a common memory address space. Partitions 120-170 may communicate with the system console 110 using a logical communication network 180. A system user, such as a scientist or engineer who desires to perform a calculation, may request computational resources from a system operator, who uses the system console 110 to allocate and manage those resources. Allocation of computational resources to partitions is described below. The HPC system 100 may have any number of computing partitions that are administratively assigned as described in more detail below, and often has only one partition that encompasses all of the available computing resources. Accordingly, this figure should not be seen as limiting the scope of the invention.

Each computing partition, such as partition 160, may be viewed logically as if it were a single computing device, akin to a desktop computer. Thus, the partition 160 may execute software, including a single operating system ("OS") instance 191 that uses a basic input/output system ("BIOS") 192 as these are used together in the art, and application software 193 for one or more system users.

Accordingly, as also shown in FIG. 1, a computing partition has various hardware allocated to it by a system operator, including one or more processors 194, volatile memory 195, non-volatile storage 196, and input and output ("I/O") devices 197 (e.g., network cards, video display devices, keyboards, and the like). However, in HPC systems like the embodiment in FIG. 1, each computing partition has a great deal more processing power and memory than a typical desktop computer. The OS software may include, for example, a Windows® operating system by Microsoft Corporation of Redmond, Wash., or a Linux operating system. Moreover, although the BIOS may be provided as firmware by a hardware manufacturer, such as Intel Corporation of Santa Clara, Calif., it is typically customized according to the needs of the HPC system designer to support high-performance computing, as described below in more detail.

As part of its system management role, the system console 110 acts as an interface between the computing capabilities of the computing partitions 120-170 and the system operator or other computing systems. To that end, the system console 110 issues commands to the HPC system hardware and software on behalf of the system operator that permit, among other things: 1) booting the hardware, 2) dividing the system computing resources into computing partitions, 3) initializing the partitions, 4) monitoring the health of each partition and any hardware or software errors generated therein, 5) distributing operating systems and application software to the various partitions, 6) causing the operating systems and software to execute, 7) backing up the state of the partition or software therein, 8) shutting down application software, and 9) shutting down a computing partition or the entire HPC system 100. These particular functions are described in more detail in the section below entitled "System Operation."

Figure 2:
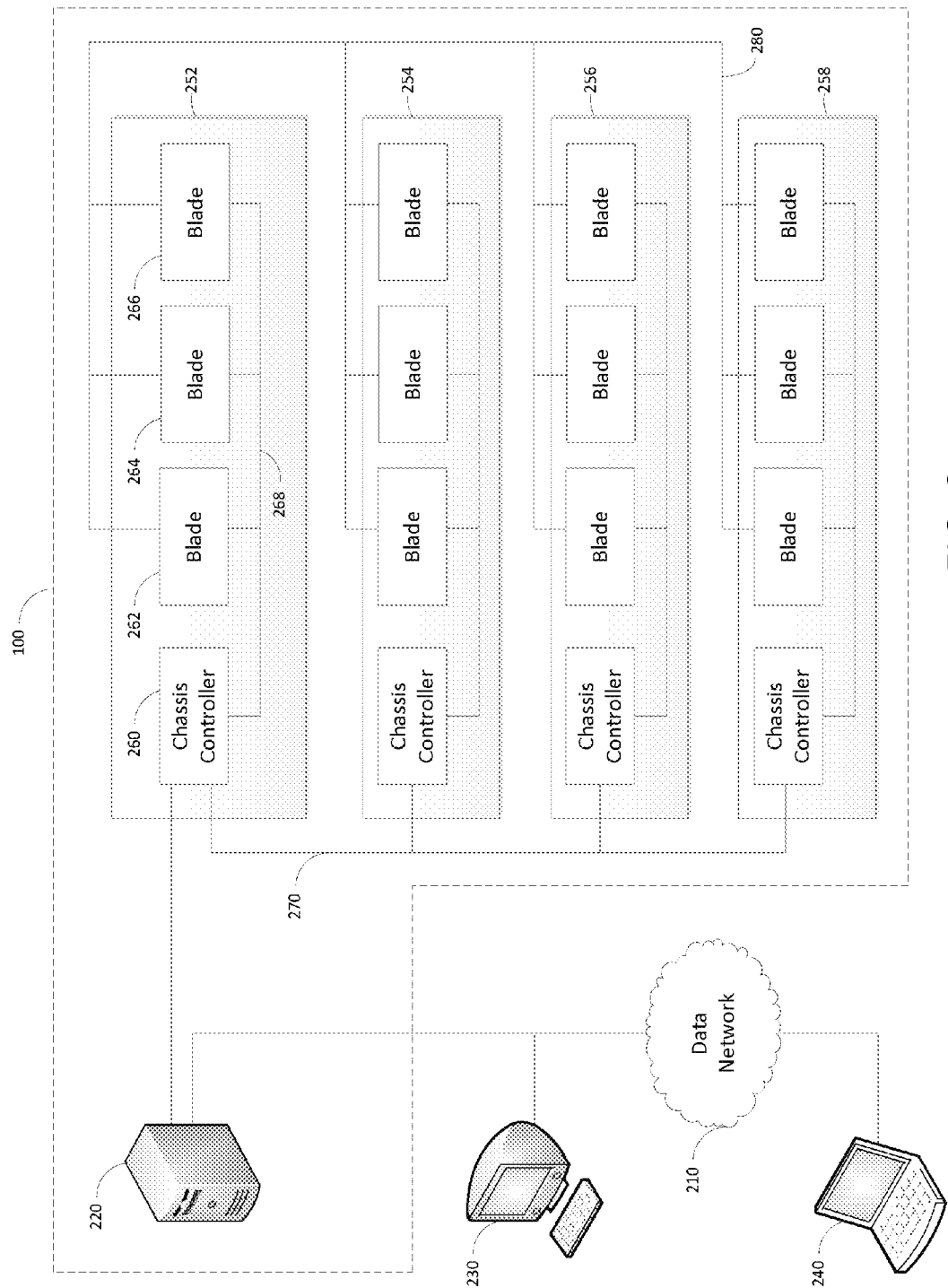
FIG. 2 schematically shows a physical view of the HPC system of FIG. 1.

FIG. 2 schematically shows a physical view of a high performance computing system 100 in accordance with the embodiment of FIG. 1. The hardware that comprises the HPC system 100 of FIG. 1 is surrounded by the dashed line. The HPC system 100 is connected to an enterprise data network 210 to facilitate user access.

The HPC system 100 includes a system management node ("SMN") 220 that performs the functions of the system console 110. The management node 220 may be implemented as a desktop computer, a server computer, or other similar computing device, provided either by the enterprise or the HPC system designer, and includes software necessary to control the HPC system 100 (i.e., the system console software).

The HPC system 100 is accessible using the data network 210, which may include any data network known in the art, such as an enterprise local area network ("LAN"), a virtual private network ("VPN"), the Internet, or the like, or a combination of these networks. Any of these networks may permit a number of users to access the HPC system resources remotely and/or simultaneously. For example, the management node 220 may be accessed by an enterprise computer 230 by way of remote login using tools known in the art such as Windows® Remote Desktop Services or the Unix secure shell. If the enterprise is so inclined, access to the HPC system 100 may be provided to a remote computer 240. The remote computer 240 may access the HPC system by way of a login to the management node 220 as just described, or using a gateway or proxy system as is known to persons in the art.

The hardware computing resources of the HPC system 100 (e.g., the processors, memory, non-volatile storage, and I/O devices shown in FIG. 1) are provided collectively by one or more "blade chassis," such as blade chassis 252, 254, 256, 258 shown in FIG. 2, that are managed and allocated into computing partitions. A blade chassis is an electronic chassis that is configured to house, power, and provide high-speed data communications between a plurality of stackable, modular electronic circuit boards called "blades." Each blade includes enough computing hardware to act as a standalone computing server. The modular design of a blade chassis permits the blades to be connected to power and data lines with a minimum of cabling and vertical space.

Accordingly, each blade chassis, for example blade chassis 252, has a chassis management controller 260 (also referred to as a "chassis controller" or "CMC") for managing system functions in the blade chassis 252, and a number of blades 262, 264, 266 for providing computing resources. Each blade, for example blade 262, contributes its hardware computing resources to the collective total resources of the HPC system 100. The system management node 220 manages the hardware computing resources of the entire HPC system 100 using the chassis controllers, such as chassis controller 260, while each chassis controller in turn manages the resources for just the blades in its blade chassis. The chassis controller 260 is physically and electrically coupled to the blades 262-266 inside the blade chassis 252 by means of a local management bus 268, described below in more detail. The hardware in the other blade chassis 254-258 is similarly configured.

The chassis controllers communicate with each other using a management connection 270. The management connection 270 may be a high-speed LAN, for example, running an Ethernet communication protocol, or other data bus. By contrast, the blades communicate with each other using a computing connection 280. To that end, the computing connection 280 illustratively has a high-bandwidth, low-latency system interconnect, such as NUMALINK, developed by Silicon Graphics International Corp. of Fremont, Calif.

The chassis controller 260 provides system hardware management functions to the rest of the HPC system. For example, the chassis controller 260 may receive a system boot command from the SMN 220, and respond by issuing boot commands to each of the blades 262-266 using the local management bus 268. Similarly, the chassis controller 260 may receive hardware error data from one or more of the blades 262-266 and store this information for later analysis in combination with error data stored by the other chassis controllers. In some embodiments, such as that shown in FIG. 2, the SMN 220 or an enterprise computer 230 are provided access to a single, master chassis controller 260 that processes system management commands to control the HPC system 100 and forwards these commands to the other chassis controllers. In other embodiments, however, an SMN 220 is coupled directly to the management connection 270 and issues commands to each chassis controller individually. Persons having ordinary skill in the art may contemplate variations of these designs that permit the same type of functionality, but for clarity only these designs are presented.

The blade chassis 252, the computing hardware of its blades 262-266, and the local management bus 268 may be provided as known in the art. However, the chassis controller 260 may be implemented using hardware, firmware, or software provided by the HPC system designer. Each blade provides the HPC system 100 with some quantity of processors, volatile memory, non-volatile storage, and I/O devices that are known in the art of standalone computer servers. However, each blade also has hardware, firmware, and/or software to allow these computing resources to be grouped together and treated collectively as computing partitions, as described below in more detail in the section entitled "System Operation."

While FIG. 2 shows an HPC system 100 having four chassis and three blades in each chassis, it should be appreciated that these figures do not limit the scope of the invention. An HPC system may have dozens of chassis and hundreds of blades; indeed, HPC systems often are desired because they provide very large quantities of tightly-coupled computing resources.

Figure 3:
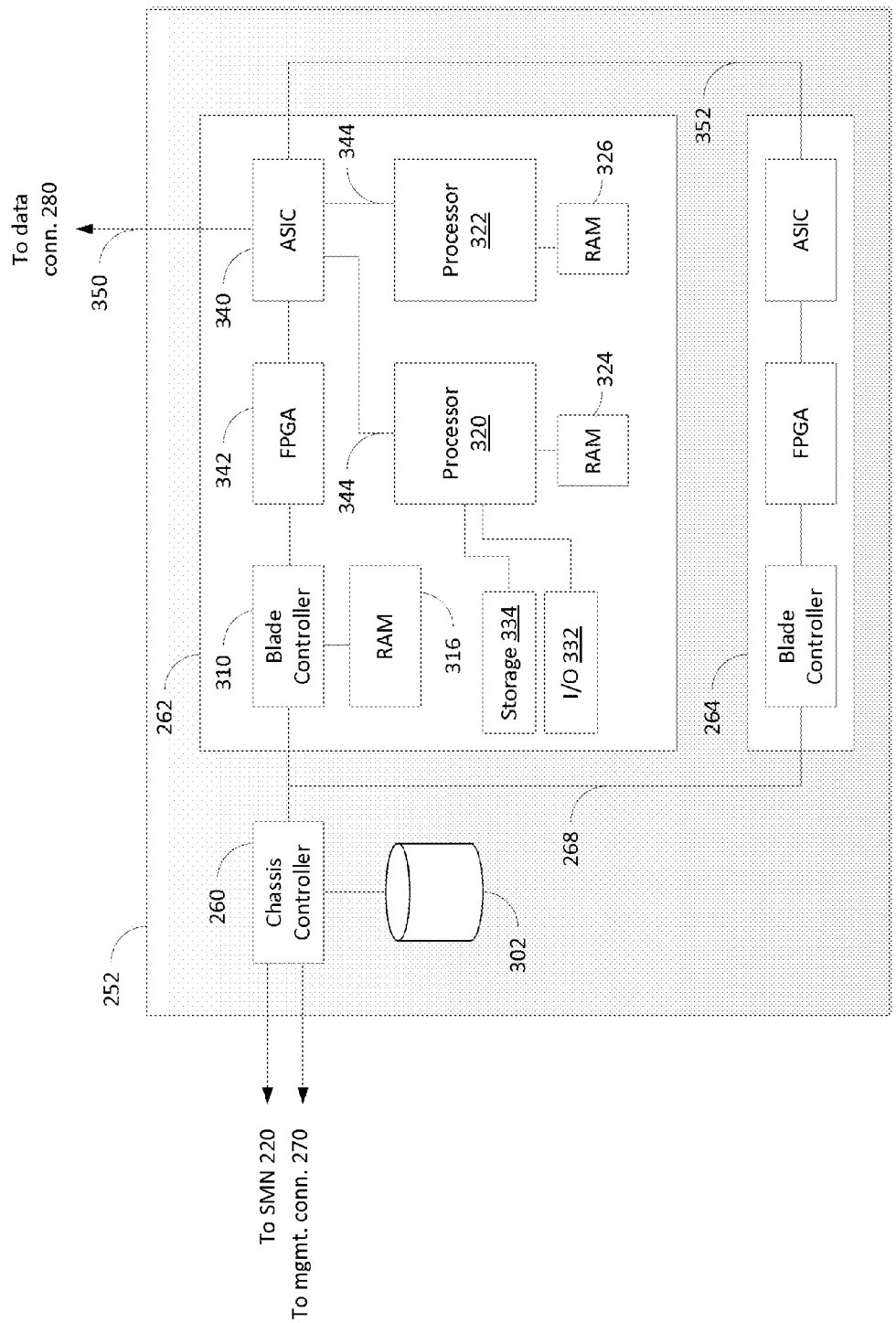
FIG. 3 schematically shows details of a blade chassis of the HPC system of FIG. 1.
Figure 4:
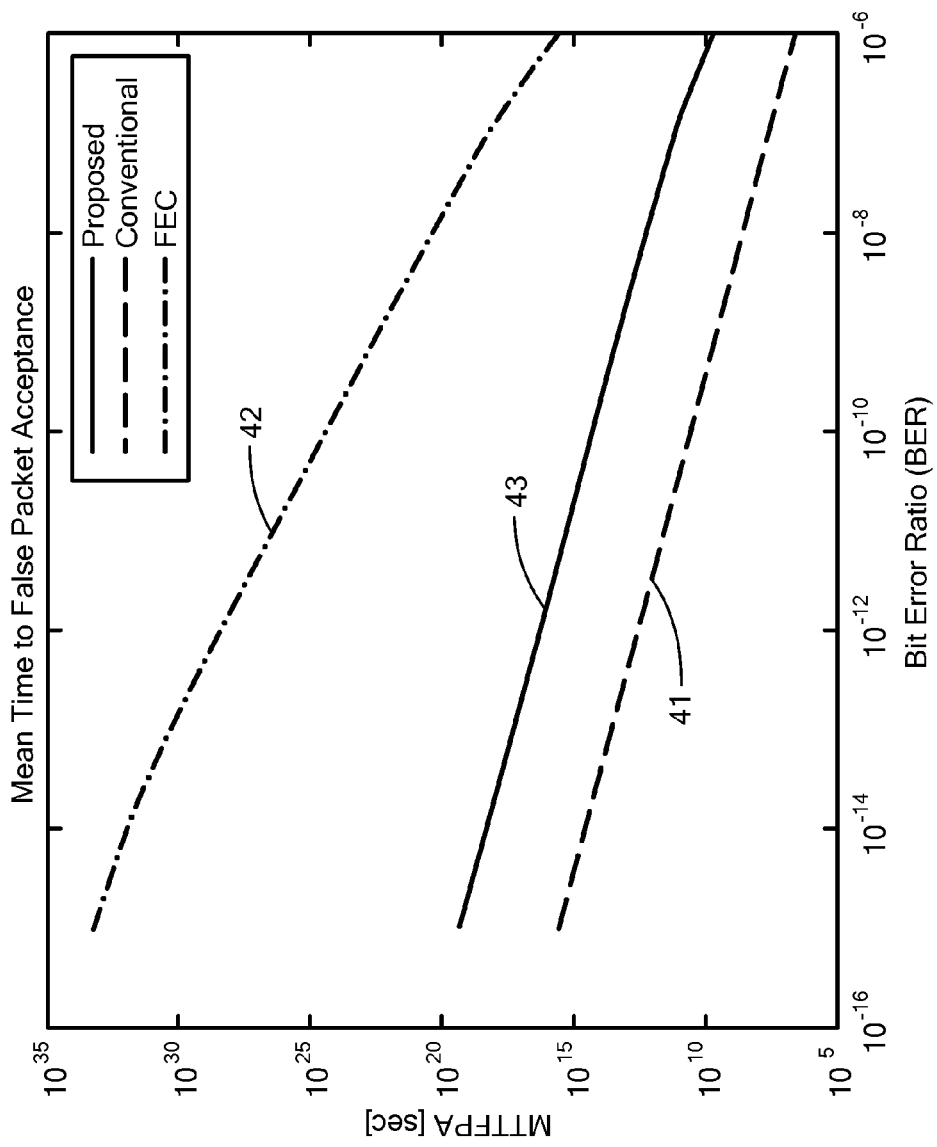
FIG. 4 is a plot of the estimated relative mean time to false packet acceptance of an embodiment of the present invention, compared with the prior art.

FIG. 3 schematically shows a single blade chassis 252 in more detail. In this figure, parts not relevant to the immediate description have been omitted. The chassis controller 260 is shown with its connections to the system management node 220 and to the management connection 270. The chassis controller 260 may be provided with a chassis data store 302 for storing chassis management data. In some embodiments, the chassis data store 302 is volatile random access memory ("RAM"), in which case data in the chassis data store 302 are accessible by the SMN 220 so long as power is applied to the blade chassis 252, even if one or more of the computing partitions has failed (e.g., due to an OS crash) or a blade has malfunctioned. In other embodiments, the chassis data store 302 is non-volatile storage such as a hard disk drive ("HDD") or a solid state drive ("SSD"). In these embodiments, data in the chassis data store 302 are accessible after the HPC system has been powered down and rebooted.

FIG. 3 shows relevant portions of specific implementations of the blades 262 and 264 for discussion purposes. The blade 262 includes a blade management controller 310 (also called a "blade controller" or "BMC") that executes system management functions at a blade level, in a manner analogous to the functions performed by the chassis controller at the chassis level. For more detail on the operations of the chassis controller and blade controller, see the section entitled "System Operation" below. The blade controller 310 may be implemented as custom hardware, designed by the HPC system designer to permit communication with the chassis controller 260. In addition, the blade controller 310 may have its own RAM 316 to carry out its management functions. The chassis controller 260 communicates with the blade controller of each blade using the local management bus 268, as shown in FIG. 3 and the previous figures.

The blade 262 also includes one or more processors 320, 322 that are connected to RAM 324, 326. Blade 262 may be alternately configured so that multiple processors may access a common set of RAM on a single bus, as is known in the art. It should also be appreciated that processors 320, 322 may include any number of central processing units ("CPUs") or cores, as is known in the art. The processors 320, 322 in the blade 262 are connected to other items, such as a data bus that communicates with I/O devices 332, a data bus that communicates with non-volatile storage 334, and other buses commonly found in standalone computing systems. (For clarity, FIG. 3 shows only the connections from processor 320 to some devices.) The processors 320, 322 may be, for example, Intel® Core™ processors manufactured by Intel Corporation. The I/O bus may be, for example, a PCI or PCI Express ("PCIe") bus. The storage bus may be, for example, a SATA, SCSI, or Fibre Channel bus. It will be appreciated that other bus standards, processor types, and processor manufacturers may be used in accordance with illustrative embodiments of the present invention.

Each blade (e.g., the blades 262 and 264) includes an application-specific integrated circuit 340 (also referred to as an "ASIC", "hub chip", or "hub ASIC") that controls much of its functionality. More specifically, to logically connect the processors 320, 322, RAM 324, 326, and other devices 332, 334 together to form a managed, multi-processor, coherently-shared distributed-memory HPC system, the processors 320, 322 are electrically connected to the hub ASIC 340. The hub ASIC 340 thus provides an interface between the HPC system management functions generated by the SMN 220, chassis controller 260, and blade controller 310, and the computing resources of the blade 262.

In this connection, the hub ASIC 340 connects with the blade controller 310 by way of a field-programmable gate array ("FPGA") 342 or similar programmable device for passing signals between integrated circuits. In particular, signals are generated on output pins of the blade controller 310, in response to commands issued by the chassis controller 260. These signals are translated by the FPGA 342 into commands for certain input pins of the hub ASIC 340, and vice versa. For example, a "power on" signal received by the blade controller 310 from the chassis controller 260 requires, among other things, providing a "power on" voltage to a certain pin on the hub ASIC 340; the FPGA 342 facilitates this task.

The field-programmable nature of the FPGA 342 permits the interface between the blade controller 310 and ASIC 340 to be reprogrammable after manufacturing. Thus, for example, the blade controller 310 and ASIC 340 may be designed to have certain generic functions, and the FPGA 342 may be used advantageously to program the use of those functions in an application-specific way. The communications interface between the blade controller 310 and ASIC 340 also may be updated if a hardware design error is discovered in either module, permitting a quick system repair without requiring new hardware to be fabricated.

Also in connection with its role as the interface between computing resources and system management, the hub ASIC 340 is connected to the processors 320, 322 by way of a high-speed processor interconnect 344. In one embodiment, the processors 320, 322 are manufactured by Intel Corporation which provides the Intel® QuickPath Interconnect ("QPI") for this purpose, and the hub ASIC 340 includes a module for communicating with the processors 320, 322 using QPI. Other embodiments may use other processor interconnect configurations.

The hub chip 340 in each blade also provides connections to other blades for high-bandwidth, low-latency data communications. Thus, the hub chip 340 includes a communications link 350 to the computing connection 280 that connects different blade chassis. This communications link 350 may be implemented using networking cables, for example. The hub ASIC 340 also includes connections to other blades in the same blade chassis 252. The hub ASIC 340 of blade 262 connects to the hub ASIC 340 of blade 264 by way of a chassis computing connection 352. The chassis computing connection 352 may be implemented as a data bus on a backplane of the blade chassis 252 rather than using networking cables, advantageously allowing the very high speed data communication between blades that is required for high-performance computing tasks. Data communication on both the inter-chassis computing connection 280 and the intra-chassis computing connection 352 may be implemented using the NUMA-LINK protocol or a similar protocol.

System Operation

System management commands generally propagate from the SMN 220, through the management connection 270 to the blade chassis (and their chassis controllers), then to the blades (and their blade controllers), and finally to the hub ASICS that implement the commands using the system computing hardware.

As a concrete example, consider the process of powering on an HPC system. In accordance with exemplary embodiments of the present invention, the HPC system 100 is powered when a system operator issues a "power on" command from the SMN 220. The SMN 220 propagates this command to each of the blade chassis 252-258 by way of their respective chassis controllers, such as chassis controller 260 in blade chassis 252. Each chassis controller, in turn, issues a "power on" command to each of the respective blades in its blade chassis by way of their respective blade controllers, such as blade controller 310 of blade 262. Blade controller 310 issues a "power on" command to its corresponding hub chip 340 using the FPGA 342, which provides a signal on one of the pins of the hub chip 340 that allows it to initialize. Other commands propagate similarly.

Once the HPC system is powered on, its computing resources may be divided into computing partitions. The quantity of computing resources that are allocated to each computing partition is an administrative decision. For example, an enterprise may have a number of projects to complete, and each project is projected to require a certain amount of computing resources. Different projects may require different proportions of processing power, memory, and I/O device usage, and different blades may have different quantities of the resources installed. The HPC system administrator takes these considerations into account when partitioning the computing resources of the HPC system 100. Partitioning the computing resources may be accomplished by programming each blade's RAM 316. For example, the SMN 220 may issue appropriate blade programming commands after reading a system configuration file.

The collective hardware computing resources of the HPC system 100 may be divided into computing partitions according to any administrative need. Thus, for example, a single computing partition may include the computing resources of some or all of the blades of one blade chassis 252, all of the blades of multiple blade chassis 252 and 254, some of the blades of one blade chassis 252 and all of the blades of blade chassis 254, all of the computing resources of the entire HPC system 100, and other similar combinations. Hardware computing resources may be partitioned statically, in which case a reboot of the entire HPC system 100 is required to reallocate hardware. Alternatively and preferentially, hardware computing resources are partitioned dynamically while the HPC system 100 is powered on. In this way, unallocated resources may be assigned to a partition without interrupting the operation of other partitions.

It should be noted that once the HPC system 100 has been appropriately partitioned, each partition may be considered to act as a standalone computing system. Thus, two or more partitions may be combined to form a logical computing group inside the HPC system 100. Such grouping may be necessary if, for example, a particular computational task is allocated more processors or memory than a single operating system can control. For example, if a single operating system can control only 64 processors, but a particular computational task requires the combined power of 256 processors, then four partitions may be allocated to the task in such a group. This grouping may be accomplished using techniques known in the art, such as installing the same software on each computing partition and providing the partitions with a VPN.

Once at least one partition has been created, the partition may be booted and its computing resources initialized. Each computing partition, such as partition 160, may be viewed logically as having a single OS 191 and a single BIOS 192. As is known in the art, a BIOS is a collection of instructions that electrically probes and initializes the available hardware to a known state so that the OS can boot, and is typically provided in a firmware chip on each physical server. However, a single logical computing partition 160 may span several blades, or even several blade chassis. A processor 320 or 322 inside a blade may be referred to as a "computing node" or simply a "node" to emphasize its allocation to a particular partition. It will be understood that a physical blade may comprise more than one computing node if it has multiple processors 320, 322 and memory 324, 326.

Booting a partition in accordance with an embodiment of the invention requires a number of modifications to be made to a blade chassis that is purchased from stock. In particular, the BIOS in each blade is modified to determine other hardware resources in the same computing partition, not just those in the same blade or blade chassis. After a boot command has been issued by the SMN 220, the hub ASIC 340 eventually provides an appropriate signal to the processor 320 to begin the boot process using BIOS instructions. The BIOS instructions, in turn, obtain partition information from the hub ASIC 340 such as: an identification (node) number in the partition, a node interconnection topology, a list of devices that are present in other nodes in the partition, a master clock signal used by all nodes in the partition, and so on. Armed with this information, the processor 320 may take whatever steps are required to initialize the blade 262, including 1) non-HPC-specific steps such as initializing I/O devices 332 and non-volatile storage 334, and 2) also HPC-specific steps such as synchronizing a local hardware clock to a master clock signal, initializing HPC-specialized hardware in a given node, managing a memory directory that includes information about which other nodes in the partition have accessed its RAM, and preparing a partition-wide physical memory map.

At this point, each physical BIOS has its own view of the partition, and all of the computing resources in each node are prepared for the OS to load. The BIOS then reads the OS image and executes it, in accordance with techniques known in the art of multiprocessor systems. The BIOS presents to the OS a view of the partition hardware as if it were all present in a single, very large computing device, even if the hardware itself is scattered among multiple blade chassis and blades. In this way, a single OS instance spreads itself across some, or preferably all, of the blade chassis and blades that are assigned to its partition. Different operating systems may be installed on the various partitions. If an OS image is not present, for example immediately after a partition is created, the OS image may be installed using processes known in the art before the partition boots.

Once the OS is safely executing, its partition may be operated as a single logical computing device. Software for carrying out desired computations may be installed to the various partitions by the HPC system operator. Users may then log into the SMN 220. Access to their respective partitions from the SMN 220 may be controlled using volume mounting and directory permissions based on login credentials, for example. The system operator may monitor the health of each partition, and take remedial steps when a hardware or software error is detected. The current state of long-running application programs may be saved to non-volatile storage, either periodically or on the command of the system operator or application user, to guard against losing work in the event of a system or application crash. The system operator or a system user may issue a command to shut down application software. Other operations of an HPC partition may be known to a person having ordinary skill in the art. When administratively required, the system operator may shut down a computing partition entirely, reallocate or deallocate computing resources in a partition, or power down the entire HPC system 100.

Inter-ASIC Communications

Figure 5:
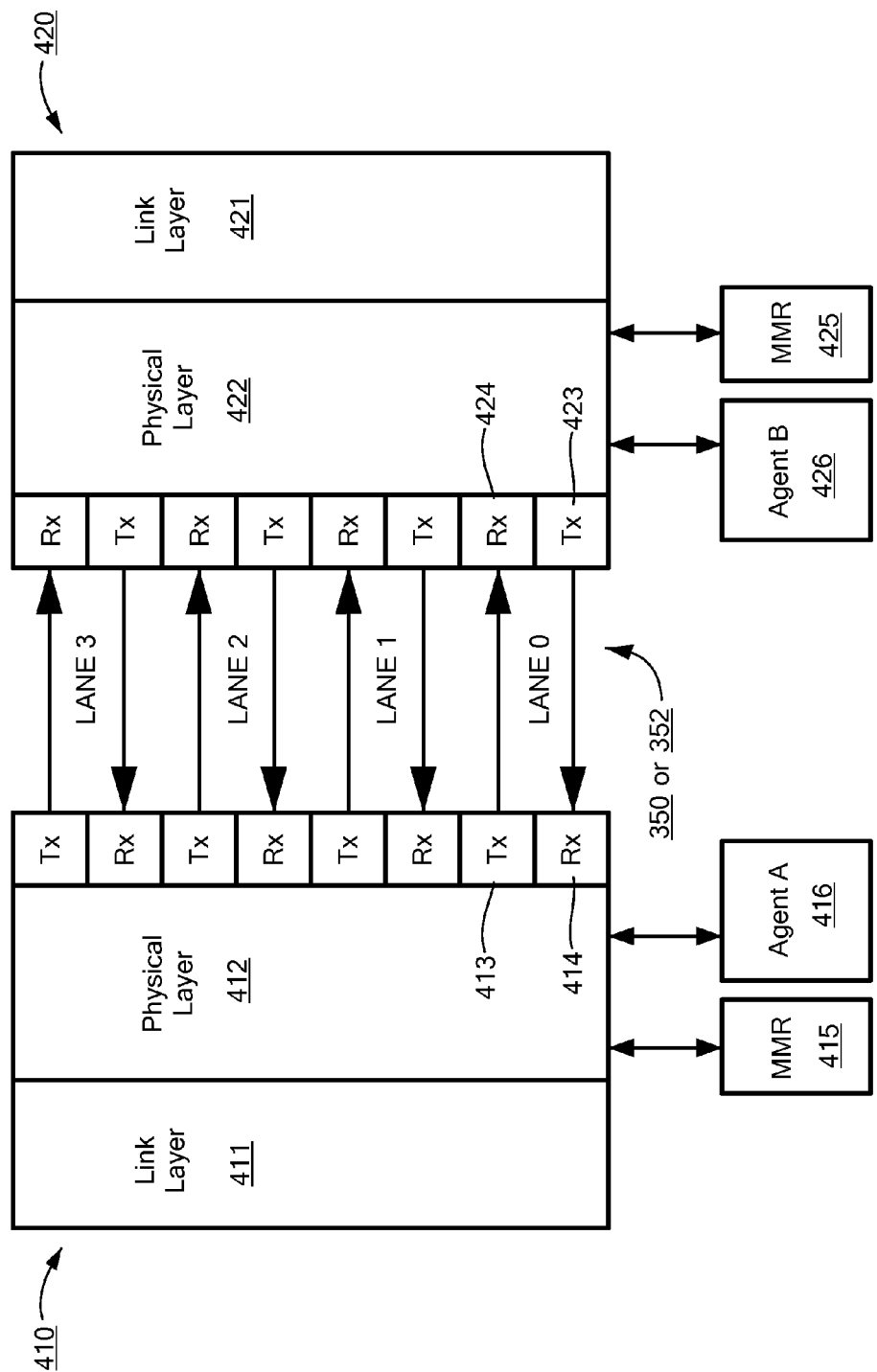
FIG. 5 schematically shows details of the inter-ASIC communications links.

FIG. 5 schematically shows details of the inter-ASIC communications links 350, 352. ASICs 410, 420 are connected by a multilane inter-ASIC communications link 350 or 352 (four lanes are depicted). Each ASIC 410, 420 is shown as having a link layer (411, 421 respectively) and a physical layer (412, 422 respectively). Other relevant portions of the ASICs 410, 420 are omitted for clarity. The physical layers 412, 422 provide each respective node access to the physical media (e.g., cabling or backplane circuitry) connecting the nodes. The link layers 411, 421 define fixed hardware addresses for the nodes, and provide one or more networking protocols (e.g. Ethernet or NUMALINK) that establish a logical link for passing data between the ASICs 410, 420 using those hardware addresses.

The communications link 350, 352 is depicted as having four bidirectional communication lanes, lane 0 through lane 3. It should be understood that the invention is not limited to the use of four lanes. The number of lanes used in any embodiment is a function of a number of factors, including: minimum bandwidth requirements, maximum latency requirements, link error rates, data retransmission overhead, commercial availability of physical connectors having a given number of lanes, and similar factors. Each such lane provides bidirectional communication between ASIC 410 and ASIC 420 using transmitters and receivers. For example, bidirectional communication using lane 0 is enabled by two unidirectional channels: one that sends from ASIC 410 to ASIC 420 using transmitter 413 and receiver 424 respectively, and one that sends data from ASIC 420 to ASIC 410 using transmitter 423 and receiver 414 respectively. The other lanes are similarly constructed.

Agent A 416 and Agent B 426 are hardware and firmware services, resident on their respective node controller ASICs 410, 420, for managing communications link 350, 352 in real-time. Each Agent 416, 426 uses an embedded packet processor to achieve the required real-time performance. The packet processor may be, for example, a smaller ASIC or a field-programmable gate array (FPGA). Memory mapped registers (MMRs) 415, 425 provide a gateway for software management that is used when real time performance is not required.

Operation of the communications link 350, 352 is now described with reference to NUMALINK as mentioned above. A message for communication from ASIC 410 to ASIC 420 is first formed. In this context, a "message" is a unit of data transfer between higher-level functions. A message may include, for example, computational data received from a processor in the node associated with the ASIC 410, system maintenance data generated by circuitry in another part of the ASIC 410, data from another node for which ASIC 410 is acting as a routing intermediary, or other such data having a meaning to a higher level protocol. In NUMALINK, a message includes a header packet, marked by a head bit, zero or more additional data packets, and ends with a tail packet marked with a tail bit.

The NUMALINK message is received in the link layer 411, which places each 128-bit packet into a "flit". In this context, a "flit" is the unit of transmission in the link layer protocol, which provides data flow control (thus, a flit is a "flow control unit"). In NUMALINK, each flit consists of the 128-bit packet together with 8 bits of flow control information and a 16-bit cyclic redundancy check (CRC). The 152-bit flit is passed to the physical layer 412, which divides it into four 38-bit "phits" as described below, and these phits are transmitted on the physical communications link 350, 352.

Transmission of data occurs using a clock signal that is synchronized between the two ASICs 410, 420. Each clock cycle, transmitters in the physical layer 412 of ASIC 410 each transmit a phit of data, using its associated lane in the communications link 350, 352, to a corresponding receiver in the physical layer 422 of the ASIC 420. The matched receiver receives this data using the synchronized clock.

Once the phits have been received, the physical layer 422 passes them to the link layer 421, which reassembles them into a flit. At this stage, the CRC is checked, and if there is a link error, an error flit is returned to the ASIC 410. If there is no error, the flit is returned to the higher layer protocols of ASIC 420 for processing.

Physical Layer Coding

Some transmission encodings used by the physical layers 412, 422 may be described using two numbers: a number of bits of payload (useful data) and a number of total bits of the payload plus its header. Thus, a standard "64B/66B" code has a useful payload of 64 bits (8 bytes) and two bits of header information added by the physical layer, for a total transmitted length of 66 bits. This code is used in most varieties of 10 Gigabit Ethernet, some varieties of Fibre Channel, and InfiniBand. Similarly, a "38B/40B" code used by Silicon Graphics International Corp. organizes data into blocks that begin with a two bit sync header followed by a 38-bit payload. A bitwise value of '10' in the header indicates that the payload is control, and a value of '01' signifies data. In 64B/66B the payload is always encoded (scrambled) to produce roughly equal numbers of 0-bits and 1-bits, while in 38B/40B only the data payload is scrambled; control payloads are not scrambled.

Each code block is mapped to a physical lane and then transmitted serially. In prior physical layer implementations of such codes, the sync header bits are transmitted first, followed by payload. At the receiver, if a DFE burst error starts on or crosses a sync header and inverts both bits, the entire block payload is decoded incorrectly. This results in an effective burst error length equal to the payload size. For example, a control block with an inverted sync header (i.e., '10' was transmitted but '01' was received) is treated as a data block. This can defeat the residual error detection capability of cyclic redundancy checks (CRC), resulting in a finite probability of false data acceptance.

Figure 6:
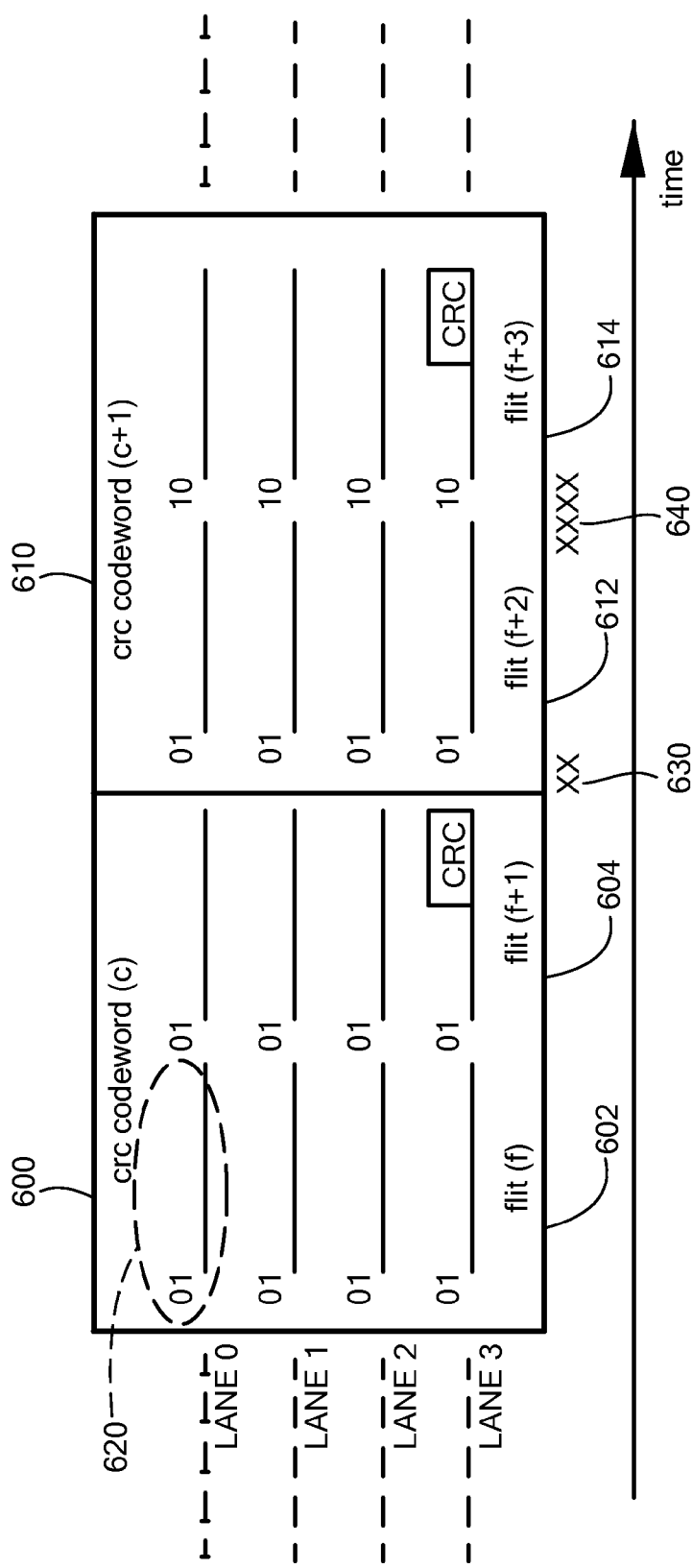
FIG. 6 shows conventional data striping across four physical lanes, with two burst errors.

FIG. 6 shows conventional data striping across four physical lanes, with two burst errors. Data are transmitted in codewords, each having a CRC that is used to detect burst errors in the payload; if a contiguous burst error is detected, a request to retransmit the codeword may be sent. In this example FIG. 6, each codeword consists of two flits, and the second flit of each codeword contains the CRC. Thus codeword "c" 600 has two flits "f" 602 and "f+1" 604, while codeword "c+1" 610 has flits "f+2" 612 and "f+3" 614. Each 152-bit flit is itself divided into four 38-bit physical layer blocks and distributed across the four physical lanes (lane 0 to lane 3) for transmission.

Two header bits are pre-pended to each block by the physical layer 412 protocol handler prior to serial transmission. Because each flit is 38 bits, this example illustrates a 38B/40B encoding scheme. For example, block 620 is a 40-bit block that is the 38-bit portion of flit 602 transmitted on lane 0, plus two header bits. Data blocks start with a '01' sync header, and control blocks start with a '10'. The other sync header combinations, '00' and '11', are unused by the protocol and their detection generates an error (and retransmission of the block). It will be appreciated from the header bits that flits 602, 604, and 612 are data flits, while flit 614 is a control flit. While FIG. 6 shows an example with two flits per codeword, it will be appreciated that other numbers of flits per codeword may be used, and other lengths of encoding schemes may be used.

Two burst errors 630, 640 are illustrated using FIG. 6. Burst error statistics apply to each of the four serial lanes independently; that is, the chance of an error on each lane is independent of the chance of an error an each other lane, since there is a separate DFE for each lane. The first correlated DFE burst error is shown by "xx" 630 in the Figure, and represents a random error in the sync header of the first flit 612 in codeword 610. The burst length is two bits, so both sync header bits are inverted. This burst error will result in the receiver obtaining '10' rather than '01' for the header bits of flit 612, and therefore the receiver will interpret the corresponding block as if it were a control block instead of a data block. This type of corruption is subtle, and may result in undetectable errors.

The second correlated DFE burst error is shown by "xxxx" 640 in FIG. 6. This example demonstrates that if a burst error starts on or before the first sync header bit of flit 614, and the burst error has sufficient length, the sync header will be inverted. Thus, the received sync header of flit 614 will be '01' instead of '10', and the corresponding block of flit 614 will be mistakenly processed by the receiver physical layer 422 as a data block instead of a control block. Moreover, if the burst error starts in the previous flit 612, detection is disadvantageously processed in relation to the receipt of flit 612, even if the burst error has sufficient length to invert the sync header in flit 614.

Lane Equivalence Checking

One solution to the problem of burst errors relies on the fact that the sync header bits for each block are identical, while the error statistics for each lane are independent. A burst error on one lane does not necessarily cause errors on the other lanes, and therefore might cause one or more sync header bits in the lane to differ from those in the other lanes. If this occurs, the receiver can determine that a receive error occurred on the lane that is different. This lane equivalence check, and subsequent retransmission of the errored flit(s), can be performed by the physical layers 412, 422 independently of higher protocol layers 411, 421 in embodiments of the invention. However, this check can only detect burst errors in the sync header bits for individual lanes; if transmission of data on all lanes is simultaneously affected, lane equivalence checking is not sufficient by itself to determine the presence of an error condition.

Modification to Physical Coding

Figure 7:
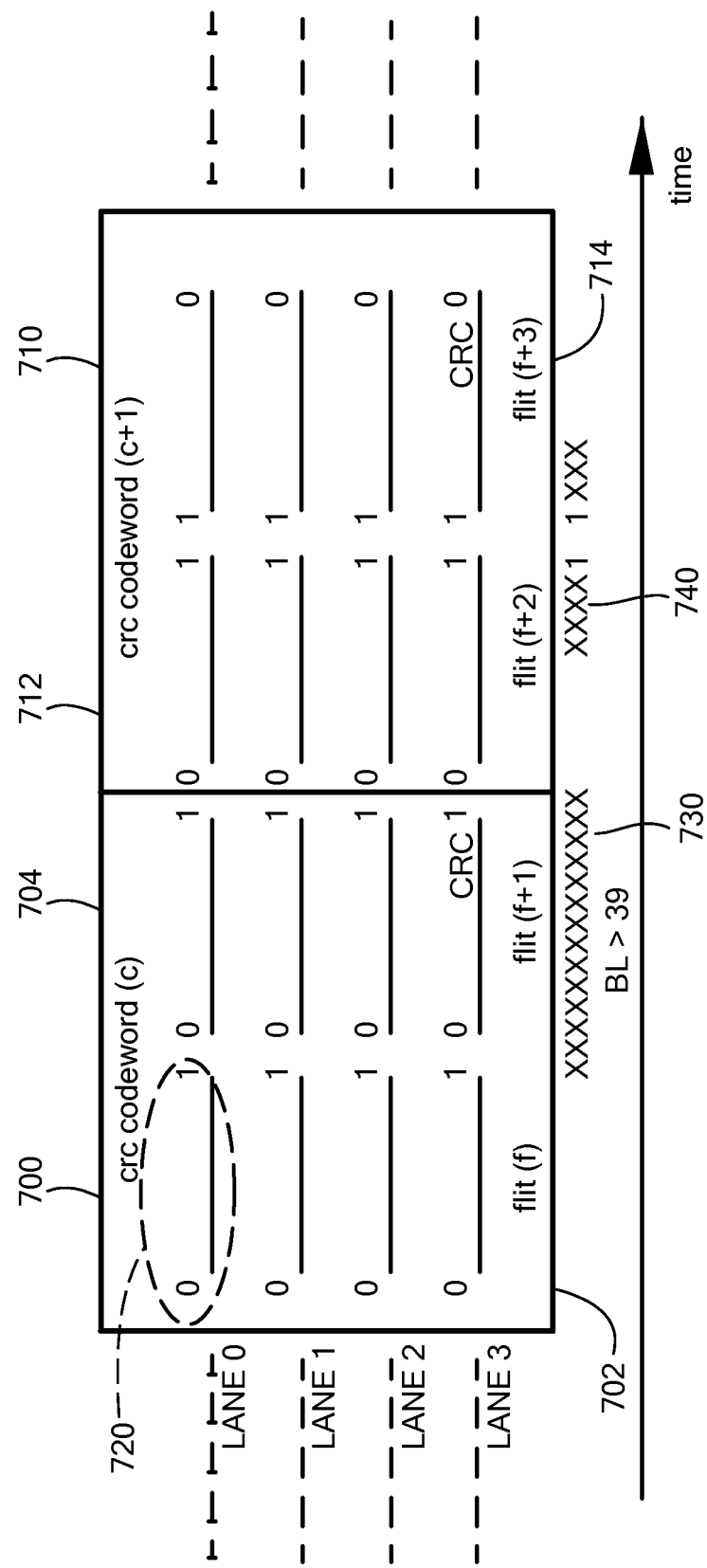
FIG. 7 schematically shows an example of a modified block encoding according to an embodiment of the invention.

In accordance with another embodiment of the present invention, rather than transmit the header bits together before the payload, each code block is mapped to a physical lane, then the first sync header bit is transmitted before the payload and the second header bit is transmitted after the payload. FIG. 7 shows an example of a modified block encoding according to an embodiment of the invention. FIG. 7 shows two codewords 700, 710 being transmitted. Codeword 700 comprises two flits 702, 704, and codeword 710 comprises two flits 712, 714. The first sync header bit of each block (e.g., block 720) is transmitted prior to the payload, and the second sync header bit is transmitted subsequent to the payload. Thus, a non-standard 38B/40B data format is obtained in accordance with this embodiment of the invention.

Two burst errors 730, 740 are illustrated using FIG. 7. The first correlated burst error 730 illustrates one advantageous feature of the encoding: for a 38B/40B code, a burst error of length 40 or longer would be required to invert both bits of the sync header for a single data block, instead of the problematic length 2 burst that occurs in the prior art. For a similarly modified 64B/66B code, a burst error of length 66 or longer would be required to invert both bits. Because burst error probability diminishes logarithmically with its length, an improvement of several orders of magnitude in MTTFPA is achieved.

Burst errors need not be contiguous for multi-tap DFEs; thus, a single "burst" may include several runs of error bits. The second example 740 shows an interesting multi-tap case where a non-contiguous burst error crosses a flit boundary (i.e., the boundary between flits 704 and 712), and inverts neither sync header bit. This creates two separate errors in codeword 710, a condition that is not absolutely detectable and has finite error probability. The problem is applicable to both the conventional, prior art code and the code in accordance with embodiments of the invention.

To determine the significance of this error case we examine the probability of this event. For a dual tap DFE the answer is straightforward: the two runs of bit errors in burst error 740 are not correlated because all error history is erased with two correct decisions (i.e., the two correctly received sync header bits). For a DFE with three or more taps, errors continue to propagate, and the answer is more involved. However, two consecutive correct decisions significantly reduce the probability of extending the burst error. Limiting the codeword size is another way to control exposure to this case. In fact, if the codeword size is reduced to one flit, the exposure is entirely eliminated, and the strongest burst error immunity is realized.

Figure 8:
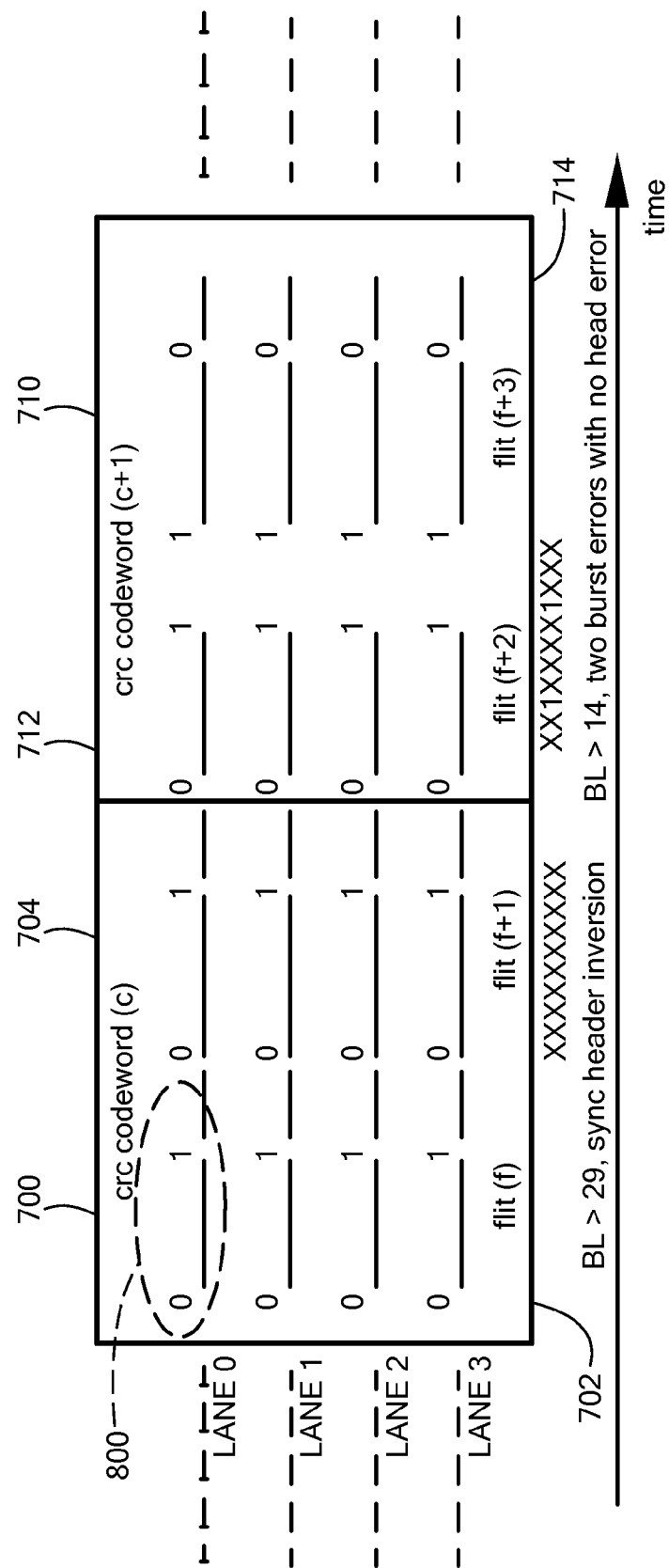
FIG. 8 schematically shows an example of a modified block encoding according to a second embodiment of the invention.

Other embodiments generalize the above concept to further adjust the locations of one or both sync header bits. For example, the leading sync header bit location may be unchanged, while the trailing sync header bit is located at a point where the overall reliability is improved. FIG. 8 shows an example of this solution, in which the trailing sync header bit is located in the middle of the payload. The data block 800 of flit 702 has sync header bits '01'; the 1-bit is separated from the 0-bit of the following data block of flit 704 by a distance that may be tailored to the particular application. In particular, the sync header bits may be located distantly from each other even across flit boundaries.

It should be appreciated that in more general embodiments, the sync header bits may be arbitrarily fixed at identical, non-adjacent locations in each block by the protocol. In such an encoding, the first and second sync header bits are placed in each block at the same location for each successive block; the differences in encodings are a result of the different locations that each such bit is chosen to occupy. However, the first and second sync header bits are placed non-adjacently, so that a single correlated burst error has a low chance of inverting both bits, and so that an intervening payload bit inverted by the burst error is detectable by the codeword CRC.

Thus, an "l-m-n" code may be used, where "l" represents the number of bits in the block prior to the first sync header bit, "m" represents the number of bits in the field between sync header bits, and "n" represents the number of bits after the second sync header bit. In what follows, the "l" field represents the bits transmitted prior to the first sync header bit, the "m" field represents the bits transmitted between the first and second sync header bits, and the "n" field represents the bits transmitted after the second sync header bit. Other variable design parameters are the choice of CRC (CRC error span), and the CRC code word size (code rate). A single burst error that crosses block boundaries becomes two separate burst errors, but each are in different code word, and are detectable if each are less than the CRC span.

Figure 9:
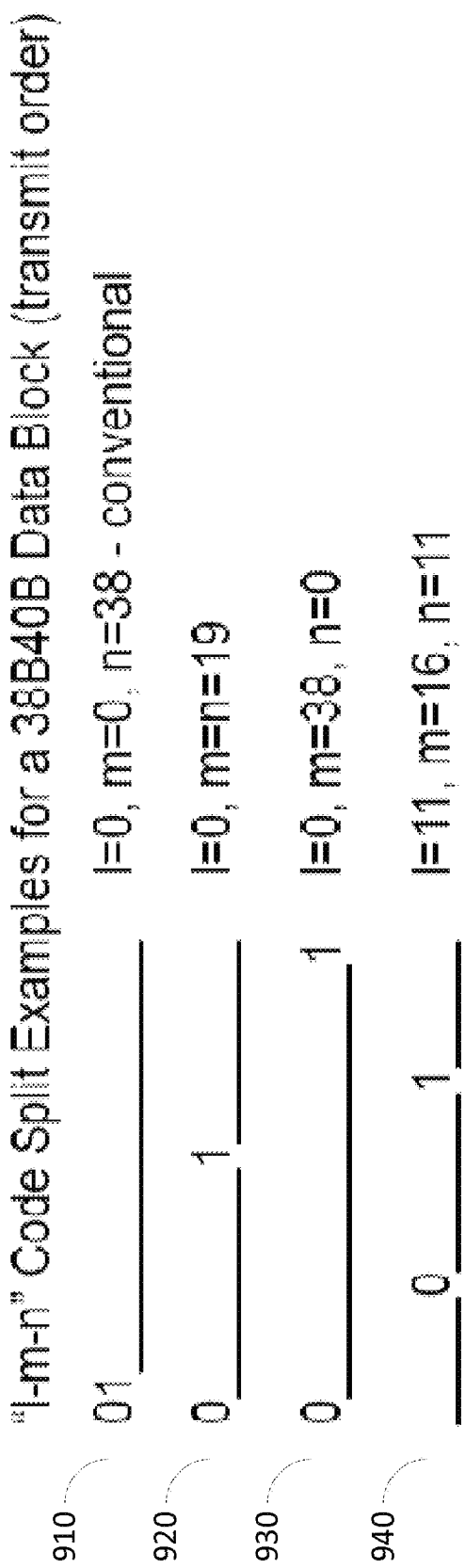
FIG. 9 schematically shows several examples of more general modifications that may be performed on block encodings in accordance with embodiments of the invention.

We discuss four "l-m-n" code splits for a 38B/40B encoding scheme with reference to FIG. 9: the conventional split 910, two splits 920 and 930 that benefit multi-flit codeword approaches, and a split 940 that is favorable to the single flit code word. With this notation, the prior art split 910 has "l-m-n"=0-0-38, and suffers from burst errors of length two or greater that cross the sync headers. As noted above, errors of length at little as two bits that land on the sync header can cause incorrect processing of an entire block of length 40 bits.

Consider split encoding 920 having "l-m-n"=0-19-19 with a CRC error detection span of 19. This code improves burst error immunity within the payload and at block crossings, and has the following properties. A burst error starting on the first sync header bit must be longer than 20 bit intervals to invert the second sync header bit. Lane equivalence checking also immunizes the link from this error condition, in multi-lane configurations. If a burst error starts in the "m" field and propagates through the second sync bit and inverts it, a header error is generated. If a multi-tap DFE burst error propagates through the second sync bit, does not invert it and is less than 21 bit intervals, the error is detected directly by CRC-19. If a burst error starts on the second sync header bit a sync header error is generated. If a burst error starts anywhere in the "n" field and propagates into the next data block through the first sync header bit of the next data block and inverts it, a header error is generated within the CRC code word. If the burst error propagates through the first sync header bit of the next data block and does not invert it, the single burst error becomes two errors after remapping in the receiver. Depending on the split lengths and the CRC, double burst error detection properties, this error may or may not be detectable.

Next consider split 930 having "l-m-n"=0-38-0. This code improves burst error immunity at flit crossings. A burst error starting on the first sync header bit must be longer than 39 bit intervals to invert the second sync header bit. Lane equivalence checking also immunizes the link from this error condition, in multi-lane configurations. If a burst error starts in the "m" field and propagates through both sync header bits and either one or both sync header bits invert, a sync header error is generated within the CRC code word. If the burst error propagates without inverting either sync header bit, the single burst error remaps to two burst errors in the receiver. Depending on the split lengths and the CRC, double burst error detection properties, this error may or may not be directly detectable.

Finally, consider split 940 having "l-m-n"=11-16-11. This split favors single flit code words, and has a CRC span of 16. If a burst error starts anywhere in the "l" field, propagates through the first sync header bit and inverts it, a header error is generated. If a burst error propagates through the sync bit, does not invert it and is less than 18 intervals, it is directly detectable by CRC-16. A burst error starting on the first sync header bit must propagate for 17 additional bit intervals to invert the second sync header bit. Lane equivalence checking also immunizes the link from this error condition, in multi-lane configurations. If a burst error starts in the first 11 positions of the "m" field and propagates through the second sync header bit and inverts it, a header error is generated. If the burst error propagates through the second sync bit, does not invert it and is less than 18 intervals, it is directly detectable by CRC-16. If a burst error starts on the second sync header bit a sync header error is generated. If a burst error starts anywhere in the last 5 positions of the "m" field or in the "n" field and propagates into the next code block, the section of the burst error in each code block is tested by the CRC span, under the assumption of one flit per CRC code word.

Properties of the Improved Coding

There are several properties that serial codes must satisfy. These properties, and how the improved code disclosed herein meets these properties, are now described.

(1) DC Balance: The number of transmitted 1-bits is equal to the number of transmitted 0-bits over a period of time to ensure that the average line voltage is acceptable to the physical materials used. Data block DC balance is met with a DC balanced sync header and with scrambled payload. Control block DC balanced is achieved with a balanced sync header, and an unscrambled payload that is DC balanced for all encodings. DC balance can be achieved within one control block or over multiple ordered control blocks.

(2) Run length limit: The protocol avoids long runs of 1-bits or 0-bits to avoid problems with the receiver clock, which is used to determine when to sample data and must be phase locked to the input signal. The worst case sequence is a data block followed by a control block, or vice versa. In 38B/40B, if the control block payload is scrambled, a worst case run length of 78 would be possible. However, the control block payload bit sequence in this code is unscrambled and predefined. It is defined in a manner that insures run length limiting transitions, as required by clock and data recovery circuits.

(3) Data Randomness: The control block ordered sequence is randomized to the extent possible, for electromagnetic interference (EMI) suppression and real-time equalizer adaption. If the control sequence is not sufficiently random, then link layer idles (scrambled) are transmitted, whenever system data is not available. In this case, flow control keeps transmit and receive buffers in the almost empty state, minimizing latency. In the present 38B/40B application link layer idles may be run at a rate of 100%, and flow control utilized to prevent buffer overflow and minimize latency.

(4) Framing: The blocks must be framed so that the receiver can detect when each block ends and the next begins. Framing normally relies on random payload in both control and data blocks. With the unscrambled 38B/40B control block, framing relies exclusively on data blocks. Flow control limits the transmission rate of control blocks. A pair of ordered control blocks, transmitted alternately, facilitate framing by having one cyclo-stationary '10' position. However, a single control block may be used as well.

(5) Flow Control: A single precision throttle point limits the injection rate into the physical layer 412 transmitter, insuring that the receive FIFO buffer in physical layer 422 never overflows. Data is always put into the receive FIFO at a slower rate than data is taken out. The receive FIFO always operates almost empty and with minimum latency.

In addition to these required properties, various embodiments of the invention also satisfy the following desired properties.

(1) Burst Error Immunity: By splitting the sync header transmission order, embodiments significantly reduce the probability that a single DFE burst error inverts the sync header.

(2) Error Multiplication: Using additive scrambling/de-scrambling of data payload avoids random and burst error multiplication that occurs in self synchronizing schemes. The disclosed code explicitly seeds the scrambler/de-scrambler using physical layer control blocks.

(3) Reliable Control Block: A preferred encoding uses a single control block with Hamming Distance=18, and 4 encoded messages. Encoded messages are used to synchronize the scrambler and de-scrambler, send lane alignment and reversal markers, send physical layer idles, and to manage in-band lane fail-over.

(4) Efficient Data Striping: The flit size divided by the number of physical lanes establishes the code block size. In disclosed embodiments, a flit is 152 bits, and the link width is four physical lanes. Therefore, 152 divided by 4 yields a code block payload size of 38 bits. With the sync header the code block size is 40 bits and connects directly to the serializer/deserializer with a port width of 40. This selection of design parameters yields an efficient, low latency interface between the link and the physical layer.

(5) Flow Control: The single precise throttle point described above compensates mismatch between the flit clock and serial channel clock frequencies. It compensates for both nominal and tolerance mismatches. This minimizes transmit and receive buffer latency, over several defined flit to channel frequency ratios. The nominal throttle rate is proportional to one minus the channel to flit frequency ratio.

The idle control block density on the interconnect is a function of the worst case oscillator mismatch. With tight tolerance between flit and channel clocks, flow control insures efficiency (limited use of control blocks), low latency (empty buffers), and rich EMI spectral content.

(6) Enhanced Error Detection: All lanes transmit code blocks synchronously, simultaneously transmitting either control or data. This insures all lanes have identical order and count of transmitted control/data blocks. This allows lane alignment checks when any type of control block is received, and not just when explicit lane alignment markers are received. This inherently provides a mechanism for detecting sync header errors, when multiple lanes are used. The probability of a sync header error occurring simultaneously in all four physical lanes is very small. A sync header error in one lane is detected by comparing the received data or control blocks across all four lanes. All blocks, data or control, must occur simultaneously in all four lanes.

(7) Error Detection and Handling before lane alignment: Each physical lane generates side-data from the received code blocks. Data blocks are sent through an alignment FIFO buffer and control blocks are discarded.

Correctable control block errors: Each block has a valid control header, and has less than nine bit errors in the payload. A 'correctable error' message is sent through the alignment FIFO with the next data block.

Uncorrectable control block errors: Each block has a valid control header, and has more than eight bit errors in the payload. An 'uncorrectable error' message is sent through the alignment FIFO with the next data block.

Header Errors: A header error occurs if the sync header value is invalid i.e. a '00' or '11'. There are two selectable operating modes for handling sync header errors. In the first mode, the header error side-data bit is set and sent with the block payload through the alignment FIFO. The header error forces a rewind or data retry. In the second mode, the payload block is analyzed to determine if it is data or control. If the payload is data, the head error side-data bit is set, the correctable block error bit is set, and these are sent through the alignment FIFO and processed normally. If the payload is control, the block is discarded, and with the next data block the head error and correctable block error bits are set. The correctable block error bit prevents a forced rewind from a header error, and is sent with the block payload through the alignment FIFO.

Consecutive Control Block Counter: A counter is provided for monitoring flow control and lane alignment. The count value is incremented with each received control block. The count value with an overflow bit is sent through the alignment FIFO with the next data block, and reset with each data block. For a contiguous chain of data blocks the count value is "zero". For a single control block in the stream, the value sent with the next data block is "one". If the maximum count limit is exceeded, the overflow bit is set, and the counter holds the limit value until the next data block reset.

Unique lane ID: Each lane transmits a unique ID that is used for lane alignment, explicit additive scrambler/de-scrambler seeding, and lane reversal detection.

(8) Error Detection and Error Handling after Lane Alignment:

Lane ID equality check: Lane alignment markers must occur in all lanes simultaneously. If this condition is violated, increment the lane alignment error counter and reset the physical layer. This check is not applicable in single lane mode.

Consecutive control block count equality check: All lanes must have identical control block count values and overflow bit values. If this condition is violated, lane alignment is lost, the lane alignment error counter is incremented, and the physical layer is reset. This check is not applicable in single lane mode. In multiple lane applications, this check provides additional protection from random and burst errors that corrupt the sync header.

Counter Overflow Error: The flow control error counter is incremented in appropriate lane(s), and the physical layer is reset.

Sync header error: There are two modes for handling sync header errors after lane alignment. In the first mode, the head error counter is incremented in appropriate lane(s). In the second mode, the correctable or uncorrectable head error counter is incremented in the appropriate lane(s). Process filtered data normally, if the head error is correctable. If uncorrectable, reset the physical layer. Header error filtering avoids costly retransmissions and physical layer resets in the presence of random single bit errors. The "consecutive block count equality check" forces a physical layer reset if an incorrect filter decision is made in one or more lane(s) in a multi-lane link. Filtered decisions may be correlated with CRC error detection, for enhanced random and correlated error monitoring.

Correctable control block error: The correctable error counter for the appropriate lane is incremented.

Uncorrectable control block error: The uncorrectable error counter is incremented, and the physical layer is reset.

General Implementation

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A computerized method of communicating a data packet using a communications link that has a plurality of communication lanes, the method comprising:
    in a first computer process, providing the data packet with flow control information and error detection information, thereby forming a flow control unit;
    in a second computer process, choosing, as a function of a type of the data packet, a transmission header from a plurality of headers, the transmission header consisting of a plurality of bits;
    in a third computer process, dividing the flow control unit into equally sized payloads, the number of payloads being equal to the number of communication lanes, each payload being associated with a respective communication lane;
    in a fourth computer process, inserting, into each payload at an identical first location, a first bit of the chosen transmission header, and inserting, into each payload at an identical second location, a second bit of the chosen transmission header, the first and second locations being non-adjacent, the combination of each payload and the inserted first and second bits forming a corresponding encoded block; and
    in a fifth computer process, simultaneously transmitting to a receiver each encoded block on the respective communication lane of its payload, whereby burst errors in reception of the encoded blocks by the receiver are detectable as a function of the first and second locations.

2. The method according to claim 1, further comprising in a sixth computer process, reassembling the encoded blocks in the receiver to recover the data packet, wherein the recovered data packet is used to perform in the receiver a portion of a shared computation in a high performance computing system.

3. The method according to claim 1, wherein the communications link includes a networking cable or a data bus on a backplane of a computer chassis.

4. The method according to claim 1, wherein the communications link has at least four communication lanes.

5. The method according to claim 1, wherein the first location is at the beginning of each block and the second location is in the middle of each block, and wherein the error detection information is a cyclic redundancy check (CRC) having a length at least half the length of the block, so that detection of burst errors within the block and between successive blocks is improved.

6. The method according to claim 1, wherein the first location is at the beginning of each block and the second location is at the end of each block, so that detection of burst errors between successive blocks is improved.

7. The method according to claim 1, wherein the error detection information is a cyclic redundancy check (CRC) having a length less than half the length of the block, and wherein the first location and the second location are separated by the length of the CRC, so that burst errors in successive blocks are detected separately.

8. The method according to claim 1, further comprising detecting a burst error by determining that the received header bits in a first communication lane differ from the received header bits in a second communication lane.

9. The method according to claim 1, further comprising detecting a burst error by determining that the received header bits in a communication lane are invalid.

10. A high performance computing system comprising a plurality of computing nodes, at least a first computing node and a second computing node being connected by a high-speed, low-latency data communications link, the first computing node including a packet processor configured to:
    provide a data packet with flow control information and error detection information, thereby forming a flow control unit;
    choose, as a function of a type of the data packet, a transmission header from a plurality of headers, the transmission header consisting of a plurality of bits;
    divide the flow control unit into equally sized payloads, the number of payloads being equal to the number of communication lanes, each payload being associated with a respective communication lane;
    insert, into each payload at an identical first location, a first bit of the chosen transmission header, and insert, into each payload at an identical second location, a second bit of the chosen transmission header, the first and second locations being non-adjacent, the combination of each payload and the inserted first and second bits forming a corresponding encoded block; and
    simultaneously transmit to the second computing node each encoded block on the respective communication lane of its payload, whereby burst errors in reception of the encoded blocks are detectable, by a packet processor in the second computing node, as a function of the first and second locations.

11. The system according to claim 10, wherein the packet processor in the first computing node or the packet processor in the second computing node reside in an application-specific integrated circuit (ASIC) or a field-programmable gate array (FPGA).

12. The system according to claim 10, wherein the second computing node is configured to:
    reassemble the encoded blocks to recover the data packet; and
    use the recovered data packet to perform a portion of a shared computation in a high performance computing system.

13. The system according to claim 10, wherein the communications link includes a networking cable or a data bus on a backplane of a computer chassis.

14. The system according to claim 10, wherein the communications link has at least four communication lanes.

15. The system according to claim 10, wherein the first location is at the beginning of each block and the second location is in the middle of each block, and wherein the error detection information is a cyclic redundancy check (CRC) having a length at least half the length of the block, so that detection of burst errors within the block and between successive blocks is improved.

16. The system according to claim 10, wherein the first location is at the beginning of each block and the second location is at the end of each block, so that detection of burst errors between successive blocks is improved.

17. The system according to claim 10, wherein the error detection information is a cyclic redundancy check (CRC) having a length less than half the length of the block, and wherein the first location and the second location are separated by the length of the CRC, so that burst errors in successive blocks are detected separately.

18. The system according to claim 10, wherein the packet processor in the second computing node is further configured to detect a burst error by determining that the received header bits in a first communication lane differ from the received header bits in a second communication lane.

19. The system according to claim 10, wherein the packet processor in the second computing node is further configured to detect a burst error by determining that the received header bits in a communication lane are invalid.

* * * * *